(12) United States Patent
Zhou et al.

(10) Patent No.: US 7,180,175 B2
(45) Date of Patent: Feb. 20, 2007

(54) THERMALLY-ENHANCED BALL GRID ARRAY PACKAGE STRUCTURE AND METHOD

(75) Inventors: Tiao Zhou, Irving, TX (US); Michael J. Hundt, Double Oak, TX (US)

(73) Assignee: STMicroelectronics, Inc., Carrollton, TX (US)

( * ) Notice: Subject to any disclaimer, the term of this patent is extended or adjusted under 35 U.S.C. 154(b) by 0 days.

(21) Appl. No.: 10/061,507

(22) Filed: Feb. 1, 2002

(65) Prior Publication Data
US 2003/0146507 A1    Aug. 7, 2003

(51) Int. Cl.
H01L 23/36    (2006.01)
(52) U.S. Cl. .............................. 257/707; 257/E23.101; 438/122
(58) Field of Classification Search ............... 257/738, 257/707, 720, 783, 796, E23.102, E23.104; 438/122
See application file for complete search history.

(56) References Cited
U.S. PATENT DOCUMENTS 6,057,601 A * 5/2000 Lau et al. .................. 257/738
6,475,327 B2 * 11/2002 Tung et al. ............... 156/306.6
6,577,013 B1 * 6/2003 Glenn et al. .................. 257/777
2001/0052647 A1 * 12/2001 Plepys et al. ............... 257/738
2002/0040751 A1 * 4/2002 Hilton et al. .................. 156/64
2002/0079572 A1 * 6/2002 Khan et al. .................. 257/707
2002/0135065 A1 * 9/2002 Zhao et al. .................. 257/738

* cited by examiner

Primary Examiner—Carl Whitehead, Jr.
Assistant Examiner—Jennifer M. Dolan
(74) Attorney, Agent, or Firm—Lisa K. Jorgenson; William A. Munck

(57) ABSTRACT

A thermally-enhanced ball grid array package structure is provided that includes an integrated circuit chip, a heat spreader and a substrate. The integrated circuit chip has a specified surface area. The heat spreader is coupled to the integrated circuit chip. The substrate is coupled to the heat spreader. The substrate has a specified surface area. The heat spreader covers a specified portion of the surface area of the substrate that is greater than the surface area of the integrated circuit chip. The heat spreader is operable to dissipate heat from the integrated circuit chip over the specified portion of the surface area of the substrate.

17 Claims, 3 Drawing Sheets

THERMALLY-ENHANCED BALL GRID ARRAY PACKAGE STRUCTURE AND METHOD

TECHNICAL FIELD OF THE INVENTION

The present invention is directed in general to integrated circuits and, more specifically, to a thermally-enhanced grid array package structure and method.

BACKGROUND OF THE INVENTION

A conventional plastic integrated circuit package generally comprises a lead frame or substrate, an integrated circuit die made of silicon, and a protective layer to protect the die and the electrical connections between the die and the substrate.

A popular packaging option for high performance integrated circuit dies is a ball grid array (BGA). Reasons for the popularity of the BGA include the absence of leads that can be bent, which greatly decreases problems resulting from improper handling and lack of planarity, and the ability of BGAs to self-center, which reduces placement problems. In addition, by using a relatively dense array of metal balls for input/output connections, BGAs provide a relatively small package size as compared with other typical packaging options.

However, because the substrate of a conventional integrated circuit package is made of fiberglass or another insulating material and the protective layer is also made of an insulating material, heat dissipation from the integrated circuit die is limited. Thus, a BGA package structure may be unable to meet thermal requirements in areas such as disk drives, automotive applications, and the like.

SUMMARY OF THE INVENTION

In accordance with the present invention, a thermally-enhanced ball grid array (BGA) package structure and method are provided that achieve lower package thermal resistance. In particular, a heat spreader is provided between an integrated circuit die and a substrate of the BGA package structure in order to evenly distribute heat from the die over the substrate surface.

According to one embodiment of the present invention, a thermally-enhanced BGA package structure is provided that includes an integrated circuit chip, a heat spreader and a substrate. The integrated circuit chip has a specified surface area. The heat spreader is coupled to the integrated circuit chip. The substrate is coupled to the heat spreader. The substrate has a specified surface area. The heat spreader covers a specified portion of the surface area of the substrate that is greater than the surface area of the integrated circuit chip. The heat spreader is operable to dissipate heat from the integrated circuit chip over the specified portion of the surface area of the substrate.

According to another embodiment of the present invention, a method for providing a thermally-enhanced ball grid array package structure comprising a plurality of metal balls is provided that includes providing a substrate coupled to the metal balls. The substrate has a specified surface area. A heat spreader is applied to the substrate. An integrated circuit chip is attached to the heat spreader. The integrated circuit chip has a specified surface area. The heat spreader covers a specified portion of the surface area of the substrate that is greater than the surface area of the integrated circuit chip. Heat is dissipated from the integrated circuit chip over the specified portion of the surface area of the substrate through the heat spreader.

Technical advantages of one or more embodiments of the present invention include providing an improved BGA package structure. In a particular embodiment, a heat spreader is provided between the integrated circuit die and the substrate of the BGA package structure, with the heat spreader extending over a large portion of the substrate. As a result, heat from the integrated circuit die is more evenly distributed over the substrate surface. Accordingly, the heat concentration on a circuit board to which the BGA is coupled is reduced, improving the BGA package structure's thermal performance and allowing the structure to be used in higher power dissipation applications.

Other technical advantages will be readily apparent to one skilled in the art from the following figures, description, and claims.

Before undertaking the DETAILED DESCRIPTION OF THE INVENTION, it may be advantageous to set forth definitions of certain words and phrases used throughout this patent document: the terms "include" and "comprise," as well as derivatives thereof, mean inclusion without limitation; the term "or," is inclusive, meaning and/or; the phrases "associated with" and "associated therewith," as well as derivatives thereof, may mean to include, be included within, interconnect with, contain, be contained within, connect to or with, couple to or with, be communicable with, cooperate with, interleave, juxtapose, be proximate to, be bound to or with, have, have a property of, or the like; and the term "controller" means any device, system or part thereof that controls at least one operation, such a device may be implemented in hardware, firmware or software, or some combination of at least two of the same. It should be noted that the functionality associated with any particular controller may be centralized or distributed, whether locally or remotely. Definitions for certain words and phrases are provided throughout this patent document, those of ordinary skill in the art should understand that in many, if not most instances, such definitions apply to prior, as well as future uses of such defined words and phrases.

BRIEF DESCRIPTION OF THE DRAWINGS

For a more complete understanding of the present invention and its advantages, reference is now made to the following description taken in conjunction with the accompanying drawings, wherein like reference numerals represent like parts, in which.

DETAILED DESCRIPTION OF THE INVENTION

Figure 1:
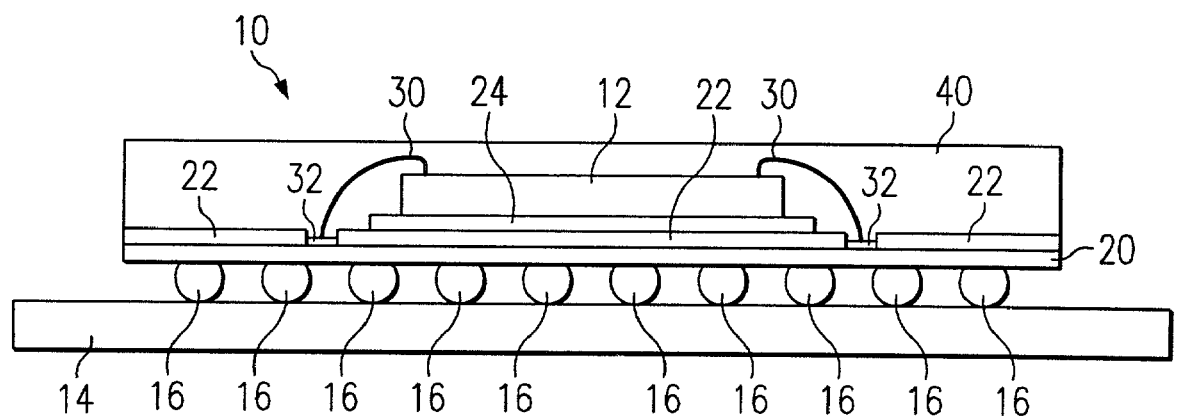
FIG. 1 is a block diagram illustrating a ball grid array (BGA) package structure in accordance with one embodiment of the present invention.
Figure 2A:
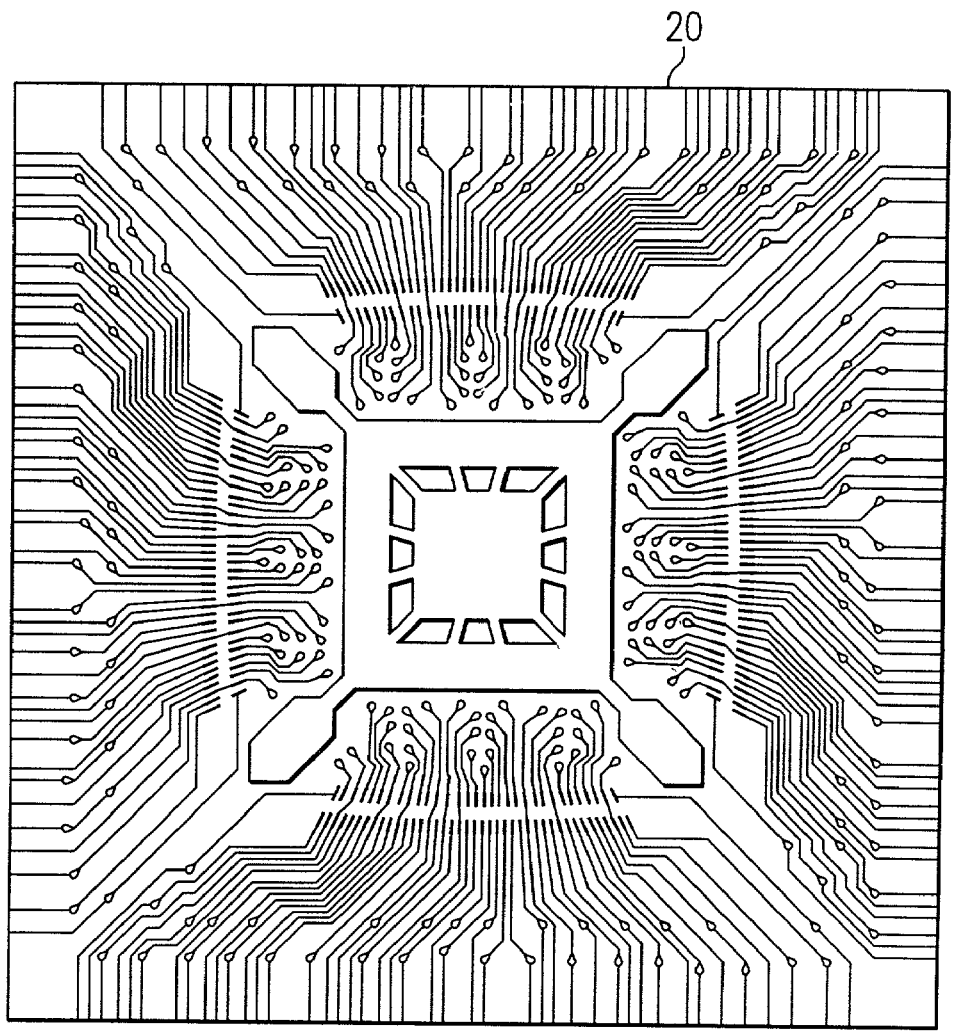
FIGS. 2A–E are block diagrams illustrating top views of selected layers of the BGA package structure of FIG. 1 in accordance with one embodiment of the present invention.
Figure 2B:
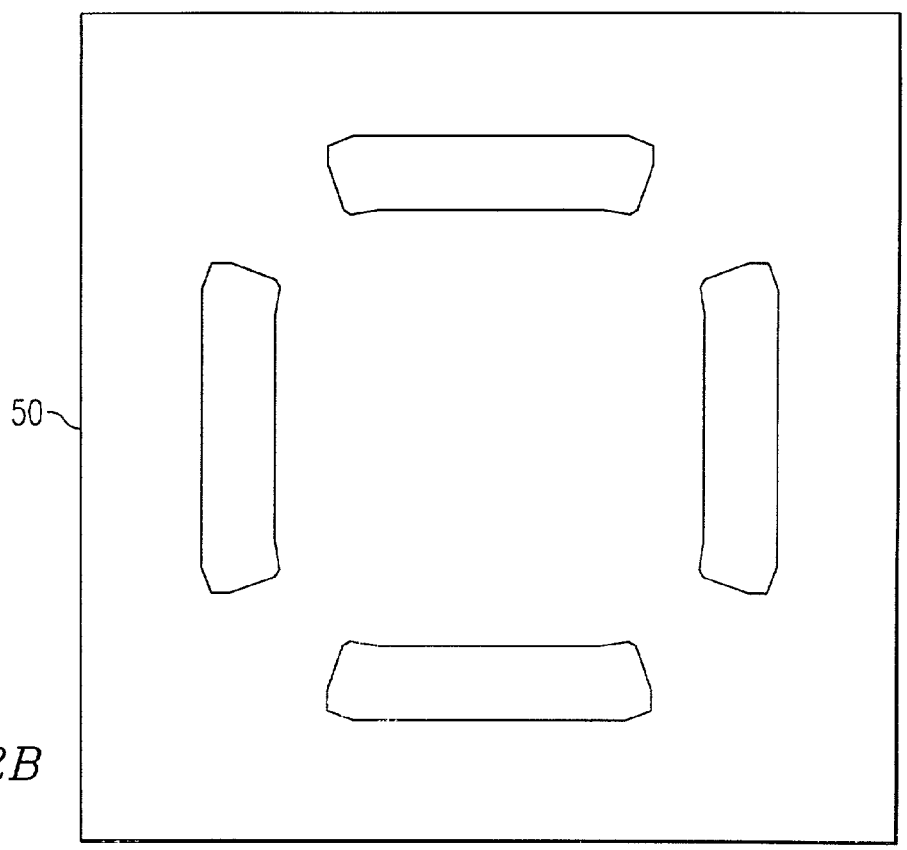
Figure 2C:
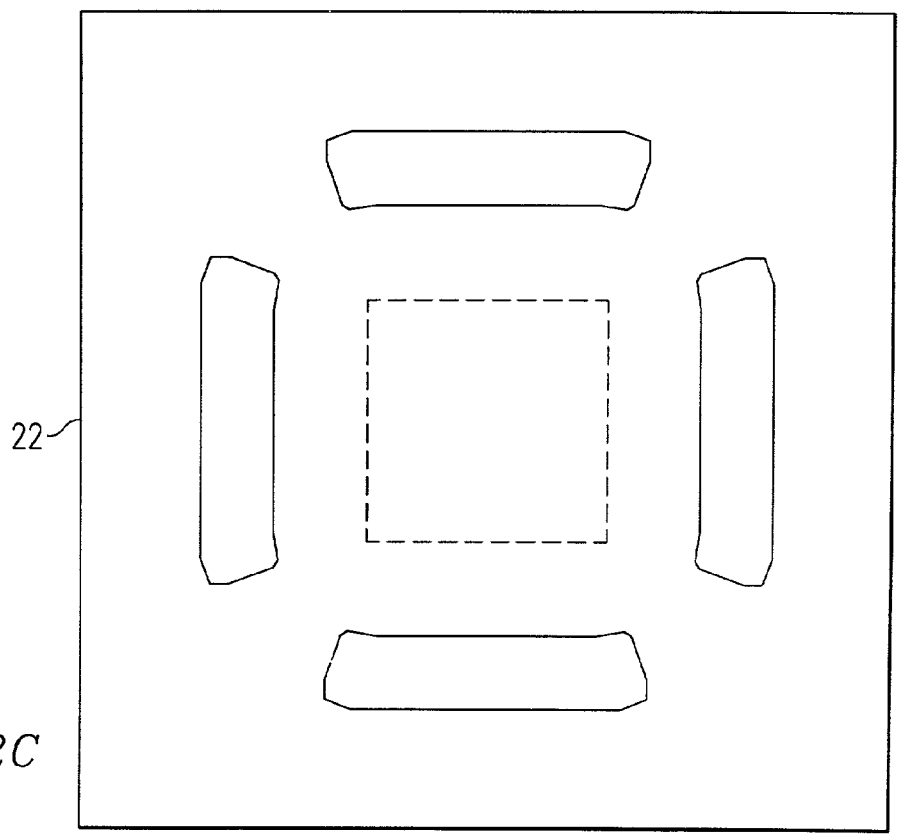
Figure 2D:
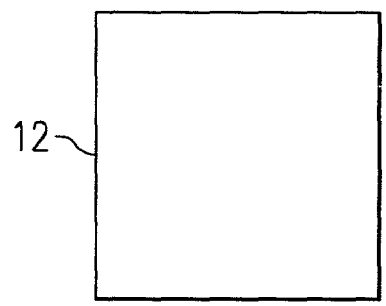
Figure 2E:
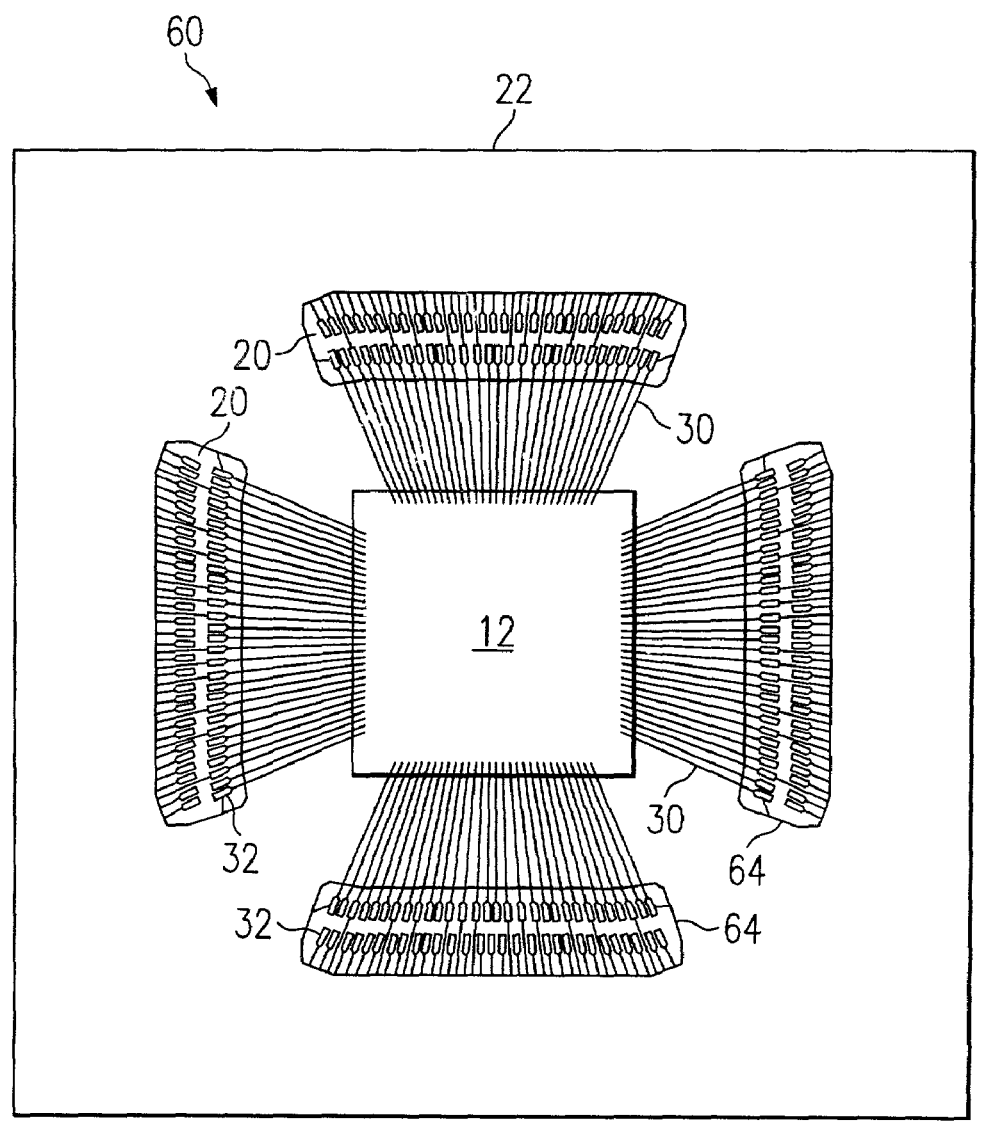

FIGS. 1 through 2E, discussed below, and the various embodiments used to describe the principles of the present invention in this patent document are by way of illustration only and should not be construed in any way to limit the scope of the invention. Those skilled in the art will understand that the principles of the present invention may be implemented for any suitably arranged grid array.

FIG. 1 is a block diagram illustrating a ball grid array (BGA) package structure 10 in accordance with one embodiment of the present invention. The structure 10 may comprise a plastic BGA or other suitable type of BGA. In an alternative embodiment, the structure 10 may comprise a land grid array. The structure 10 comprises an integrated circuit die, or chip, 12 coupled to a printed circuit board 14 through a plurality of metal balls 16, such as solder balls or balls comprising gold, tin or other suitable metal.

The structure 10 also comprises a substrate 20, a heat spreader 22, and a coupling layer 24. Openings in the heat spreader 22 allow bonding wires 30 to couple specified areas of the chip 12 to bonding fingers 32, which couple the specified areas of the chip 12 to the metal balls 16. In addition, the structure 10 comprises an encapsulation 40 over the chip 12, heat spreader 22, bonding wires 30 and bonding fingers 32.

The chip 12 may comprise a microprocessor, a microcontroller, a memory device, an application-specific integrated circuit, or any other suitable integrated circuit device. The chip 12, which may comprise silicon or other suitable material, is operable to function in an environment in which heat dissipation requirements are increased as compared with typical chip applications, as well as in a typical environment.

The printed circuit board 14 may comprise any suitable circuit board in which the chip 12 may be utilized. The metal balls 16 are operable to couple the chip 12 to the printed circuit board 14. The substrate 20 may comprise a fiberglass material or other suitable dielectric material.

According to one embodiment, the heat spreader 22 comprises copper. However, it will be understood that the heat spreader 22 may comprise any suitable thermally conductive material without departing from the scope of the present invention. The heat spreader 22 is attached to the substrate 20 with an adhesive layer (not shown in FIG. 1).

The heat spreader 22 covers a portion of the surface area of the substrate 20 that is greater than the surface area of the chip 12. For a particular embodiment, the heat spreader 22 covers at least 75% of the surface area of the substrate 20. However, it will be understood that the heat spreader 22 may cover any suitable portion of the surface area of the substrate 20 that is greater than the surface area of the chip 12 without departing from the scope of the present invention. Thus, the heat spreader 22 is operable to dissipate heat from the chip 12 evenly across the substrate 20, which conducts the heat to the printed circuit board 14 through the metal balls 16.

The coupling layer 24 may comprise any suitable die attach material operable to couple the chip 12 to the heat spreader 22. For example, the coupling layer 24 may comprise silver-filled epoxy or other suitable adhesive material.

The bonding wires 30 and bonding fingers 32 may comprise a gold compound, such as Ni/Au, or other suitable electrically conductive material. The bonding wires 30 are operable to couple specified areas of the chip 12 to the bonding fingers 32. The bonding fingers 32 are operable to couple the specified areas of the chip 12 to the printed circuit board 14 through the metal balls 16.

The encapsulation 40 may comprise any suitable insulating material, such as molding compound or the like. The encapsulation 40 is operable to cover the chip 12, heat spreader 22, bonding wires 30 and bonding fingers 32, thereby protecting the chip 12 and the electrical connections between the chip 12 and the substrate 20.

FIGS. 2A–E are block diagrams illustrating top views of selected layers of the BGA package structure 10 in accordance with one embodiment of the present invention. FIGS. 2A–D illustrate four of the layers of the structure 10, while FIG. 2E illustrates a top view of the four layers of FIGS. 2A–D coupled together.

FIG. 2A illustrates the top of the substrate 20 in accordance with one embodiment of the present invention. An adhesive layer 50 is illustrated in FIG. 2B. The adhesive layer 50 may comprise pre-preg or other suitable adhesive material and is operable to couple the heat spreader 22 to the top of the substrate 20. FIG. 2C illustrates the heat spreader 22 in accordance with one embodiment of the present invention. FIG. 2D illustrates the chip 12 in accordance with one embodiment of the present invention.

Thus, according to one embodiment, the chip 12 may be applied to the heat spreader 22, and the heat spreader 22 may be coupled to the substrate 20 through the adhesive layer 50. The resulting structure 60 is illustrated in FIG. 2E.

In this embodiment, the chip 12 is applied to the heat spreader 22. Both the heat spreader 22 and the adhesive layer 50 (not shown in FIG. 2E) comprise openings 64 to allow the chip 12 to be coupled to the substrate 20 through bonding wires 30 and bonding fingers 32. In addition, in accordance with the illustrated embodiment, the heat spreader 22 covers at least 75% of the surface area of the substrate 20.

In this way, heat from the chip 12 is evenly distributed over the surface of the substrate 20. Accordingly, the heat concentration on the printed circuit board 14 is reduced, improving the performance of the BGA package structure 10 and allowing the structure 10 to be used in higher power dissipation applications.

Although the present invention has been described with several embodiments, various changes and modifications may be suggested to one skilled in the art. It is intended that the present invention encompass such changes and modifications as fall within the scope of the appended claims.

What is claimed is:

1. A thermally-enhanced ball grid array package structure, comprising:
   an integrated circuit chip having a specified surface area;
   a heat spreader coupled to the integrated circuit chip; and
   a substrate coupled to the heat spreader, the substrate having a specified surface area, the heat spreader covering a specified portion of the surface area of the substrate that is greater than the surface area of the integrated circuit chip, the heat spreader operable to evenly distribute heat from the integrated circuit chip over the specified portion of the surface area of the substrate, the heat spreader comprising a plurality of openings;
   a pre-formed adhesive layer adhering at least a portion of a first surface of the heat spreader to a plurality of bonding fingers, and adhering at least a portion of a second surface of the heat spreader to a surface of the substrate underlying the plurality of bonding fingers, the adhesive layer including a plurality of openings aligned with the openings through the heat spreader, the plurality of bonding fingers each having a corresponding bonding wire, the bonding fingers and bonding wires operable to couple the integrated circuit chip to the substrate through the openings in the heat spreader and adhesive layer;
   an encapsulation operable to encapsulate at least a portion of the integrated circuit chip, the heat spreader, the bonding wires, and the bonding fingers; and
   a plurality of metal balls coupled to the substrate, the metal balls operable to couple the integrated circuit chip to a printed circuit board, the metal balls further operable to distribute heat from the substrate to the printed circuit board.

2. The structure of claim 1, the heat spreader comprising copper.

3. The structure of claim 1, wherein the adhesive layer has a shape substantially identical to the heat spreader.

4. The structure of claim 3, the adhesive layer comprising pre-preg.

5. The thermally-enhanced ball grid array package structure according to claim 1, wherein the heat spreader covers at least 75% of the surface area of the first substrate surface.

6. The structure of claim 1, wherein the specified portion comprises at least 75% of the surface area of the substrate.

7. A thermally-enhanced ball grid array package structure, comprising:
   a substrate having a specified surface area;
   a heat spreader coupled to the substrate, the heat spreader covering a specified portion of the surface area of the substrate, the specified portion greater than a surface area of an integrated circuit chip operable to be coupled to the substrate through the heat spreader, the heat spreader operable to evenly distribute heat from the integrated circuit chip over the specified portion of the surface area of the substrate, the heat spreader comprising a plurality of openings;
   a pre-formed adhesive layer adhering at least a portion of a first surface of the heat spreader to a plurality of bonding fingers, and adhering at least a portion of a second surface of the heat spreader to a surface of the substrate underlying the plurality of bonding fingers, the adhesive layer including a plurality of openings aligned with the openings through the heat spreader, the plurality of bonding fingers each having a corresponding bonding wire, the bonding fingers and bonding wires operable to couple the integrated circuit chip to the substrate through the openings in the heat spreader and adhesive layer;
   an encapsulation comprising one or more insulating materials and operable to encapsulate at least a portion of the integrated circuit chip, the heat spreader, the bonding wires, and the bonding fingers; and
   a plurality of metal balls coupled to the substrate, the metal balls operable to couple the integrated circuit chip to a printed circuit board, the metal balls further operable to distribute heat from the substrate to the printed circuit board.

8. The structure of claim 7, the heat spreader comprising copper.

9. The structure of claim 7, wherein the adhesive layer has a shape substantially identical to the heat spreader.

10. The structure of claim 9, the adhesive layer comprising pre-preg.

11. The structure of claim 7, wherein the specified portion comprises at least 75% of the surface area of the substrate.

12. A method for providing a thermally-enhanced ball grid array package structure, comprising:
   providing a substrate having a specified surface area;
   applying a heat spreader to the substrate with an intervening pre-formed adhesive layer adhering at least a portion of a first surface of the heat spreader to a plurality of bonding fingers and adhering at least a portion of a second surface of the heat spreader to a surface of the substrate underlying the plurality of bonding fingers;
   applying an integrated circuit chip to the heat spreader, the integrated circuit chip having a specified surface area, the heat spreader covering a specified portion of the surface area of the substrate, the specified portion greater than the surface area of the integrated circuit chip, the heat spreader operable to evenly distribute heat from the integrated circuit chip over the specified portion of the surface area of the substrate;
   coupling the integrated circuit chip to the substrate through a plurality of openings through the heat spreader and adhesive layer using a plurality of bonding wires and the bonding fingers;
   encapsulating at least a portion of the integrated circuit chip, the heat spreader, the bonding wires, and the bonding fingers using an encapsulation, the encapsulation comprising one or more insulating materials; and
   applying a plurality of metal balls to the substrate, the metal balls operable to couple the integrated circuit chip to a printed circuit board, the metal balls further operable to distribute heat from the substrate to the printed circuit board.

13. The method of claim 12, the heat spreader comprising copper.

14. The method of claim 12, wherein the adhesive layer has a shape substantially identical to the heat spreader.

15. The method of claim 14, the adhesive layer comprising pre-preg.

16. The method of claim 12, wherein the specified portion comprises at least 75% of the surface area of the substrate.

17. A thermally-enhanced ball grid array package structure, comprising:
   an integrated circuit chip coupled to a first surface of an insulating substrate material on which are formed patterned conductive traces;
   a heat spreader coupled to the first surface of the insulating substrate material, the heat spreader comprising a plurality of openings and covering a surface area of the first surface of the insulating substrate material greater than a surface area of the integrated circuit chip;
   a pre-formed adhesive layer adhering at least a portion of a first surface of the heat spreader to at least portions of the patterned conductive traces and adhering at least a portion of a second surface of the heat spreader to the first surface of the insulating substrate material, the adhesive layer including a plurality of openings aligned with the openings through the heat spreader; and
   a plurality of solder balls on a second surface of the insulating substrate material opposite the first surface, the plurality of solder balls electrically connected through the patterned conductive traces to the integrated circuit die.

* * * * *